United States Patent

Jiang

(10) Patent No.: US 7,781,792 B2
(45) Date of Patent: Aug. 24, 2010

(54) SOLID STATE ILLUMINATION DEVICE

(75) Inventor: Wen-Jang Jiang, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 146 days.

(21) Appl. No.: 12/212,982

(22) Filed: Sep. 18, 2008

(65) Prior Publication Data

US 2009/0146173 A1    Jun. 11, 2009

(30) Foreign Application Priority Data

Dec. 11, 2007    (CN)    ......... 2007 1 0202988

(51) Int. Cl.
*H01L 33/00* (2010.01)

(52) U.S. Cl. .............. 257/99; 257/E33.058

(58) Field of Classification Search ........... 257/99, 257/E33.058

See application file for complete search history.

(56) References Cited

U.S. PATENT DOCUMENTS 4,984,057 A * 1/1991 Mii ..................... 257/692

6,831,306 B1 * 12/2004 Uehran ................. 257/100
2006/0175615 A1 * 8/2006 Kok-Soon et al. ........ 257/79
2006/0220052 A1 * 10/2006 Kamiya et al. .......... 257/99
2008/0012125 A1    1/2008 Son

FOREIGN PATENT DOCUMENTS

JP    8130328 A    5/1996
JP    8204238 A    8/1996

* cited by examiner

*Primary Examiner*—Lex Malsawma
(74) *Attorney, Agent, or Firm*—Andrew C. Cheng

(57) ABSTRACT

A solid state illumination device includes a solid state light emitting diode and a mounting base. The solid state light emitting diode includes encapsulation material, a wafer, and first and second electrodes. The first and second electrodes have first ends electrically connecting with the wafer, and opposite second ends exposed outside the encapsulation material. The wafer and the first ends are encapsulated in the encapsulation material. The mounting base includes a main body with a receptacle defined therein, first and second receiving holes receiving the first and second electrodes. The main body defines an indent communicating with the first receiving holes receiving a bulge extending from the first electrodes.

9 Claims, 4 Drawing Sheets

SOLID STATE ILLUMINATION DEVICE

BACKGROUND

1. Field of the Invention

The present invention generally relates to solid state illumination devices, and particularly to illumination devices using solid state light emitting diodes (LEDs).

2. Description of Related Art

Solid state LEDs are widely used, such as in illumination devices or non-emissive display devices, due to high brightness, long lifespan, and wide color variety.

Illumination devices such as Christmas lights or rainbow lamps typically include a mounting base and a solid state LED mounted thereon. The solid state LED includes a substrate, a transparent material, a wafer, and positive and negative electrodes. The wafer is encapsulated in the substrate by the transparent material and electrically connects with top ends of the electrodes. Bottom ends of the electrodes extend through the substrate and are inserted into receiving holes defined in the mounting base. The bottom ends of the positive and negative electrodes electrically connect with positive and negative power supply electrodes located in the mounting base, electrically connecting the wafer to the power supply electrodes.

During assembly of the illumination device, the positive and negative electrodes need to electrically connect to the positive and negative power supply electrodes, respectively. A process for distinguishing the positive and negative electrodes is thus needed. However, the positive and negative electrodes have substantially the same configuration, complicating the process and prolonging the assembly time. Therefore, an illumination device is needed to address the described limitations.

SUMMARY

A solid state illumination device is provided. The solid state illumination device includes a solid state light emitting diode and a mounting base. The solid state light emitting diode includes encapsulation material, a wafer, and first and second electrodes. The first and second electrodes have first ends electrically connecting with the wafer, and opposite second ends exposed to the exterior of the encapsulation material. The wafer and the first ends are encapsulated in the encapsulation material. The mounting base includes a main body with a receptacle defined therein, and first and second receiving holes receiving the first and second electrodes, respectively. The main body defines an indent communicating with the first receiving holes receiving a bulge extending from the first electrodes.

Other advantages and novel features of the present solid state illumination device will become more apparent from the following detailed description of preferred embodiments when taken in conjunction with the accompanying drawings.

DETAILED DESCRIPTION

Figure 1:
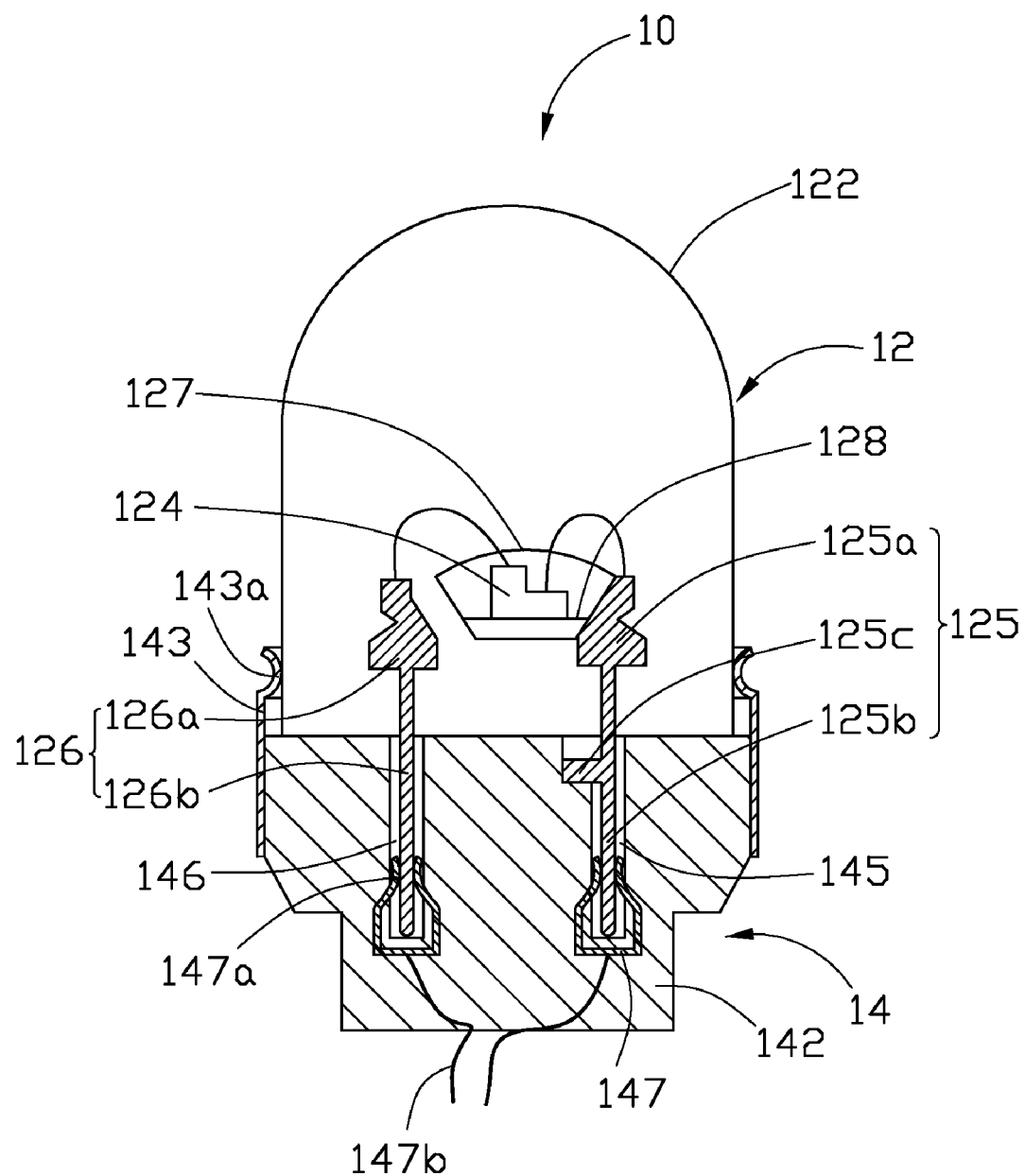
FIG. 1 is an assembled cross section of a solid state illumination device according to an embodiment of the present invention.

Reference will now be made to the drawing figures to describe the preferred embodiment in detail.

Figure 2:
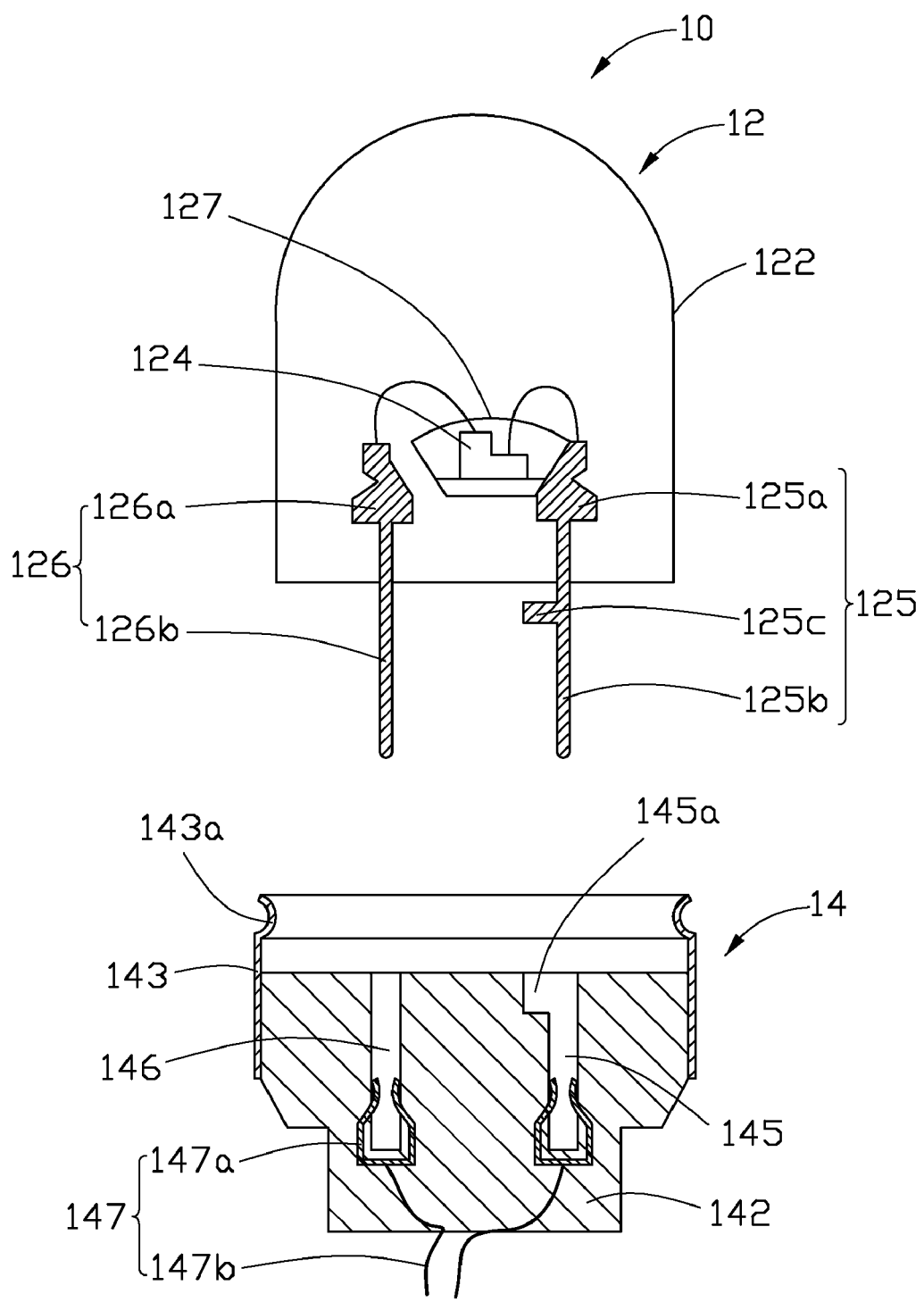
FIG. 2 is an exploded view of the solid state illumination device of FIG. 1.

Referring to FIGS. 1 and 2, a solid state illumination device 10 includes a solid state light emitting diode, and a mounting base 14 bearing the solid state light emitting diode. The solid state light emitting diode can be inorganic (LED) or organic (OLED). In the illustrated embodiment, the solid state light emitting diode is an LED 12.

The LED 12 includes encapsulation material 122, a wafer 124, a first electrode 125, a second electrode 126, and a housing 127.

The encapsulation material 122 is transparent and light pervious, such as epoxy resin or silicone.

The first and second electrodes 125, 126 are made of conductive materials such as copper, iron, or metal alloys. The housing 127 is integrally formed with the first electrode 125. The wafer 124 is received in the housing 127 and is fixed to a bottom end of the housing 127 via silver adhesive 128. Top ends 125a, 126a of the first and second electrodes 125, 126 are encapsulated in the encapsulation material 122 and electrically connect with the wafer 124 via gold wires. Bottom ends 125b, 126b of the first and second electrodes 125, 126 are outside of the encapsulation material 122 and extend into the mounting base 14.

A bulge 125c is formed on the first electrode 125 located in the mounting base 14 below and adjacent to the encapsulation material 122. The bulge 125c is integrally formed with the first electrode 125, and extends from the first electrode 125 towards the second electrode 126. A transverse section of the bulge 125c is rectangular.

The mounting base 14 includes a main body 142 with a receptacle defined therein, a resilient ring 143, first and second receiving holes 145, 146, and two power supply electrodes 147.

The resilient ring 143 is a resilient ring-shaped tube mounted around a top portion of the main body 142. Alternatively, the resilient ring 143 may integrally and upwardly extend from a topmost edge of the main body 142, and formed with the main body 142 from a single piece. The resilient ring 143 is resilient material such as plastic or rubber. A top end of an outer surface of the resilient ring 143 indents inwardly and an annular protrusion 143a is thus formed on a top end of an inner surface of the resilient ring 143. The inner diameter of the annular protrusion 143a is less than that of a bottom portion of the encapsulation material 122. The bottom portion of the encapsulation material 122 intimately contacts with the annular protrusion 143a of the resilient ring 143 when the LED 12 is mounted to the mounting base 14.

Figure 3:
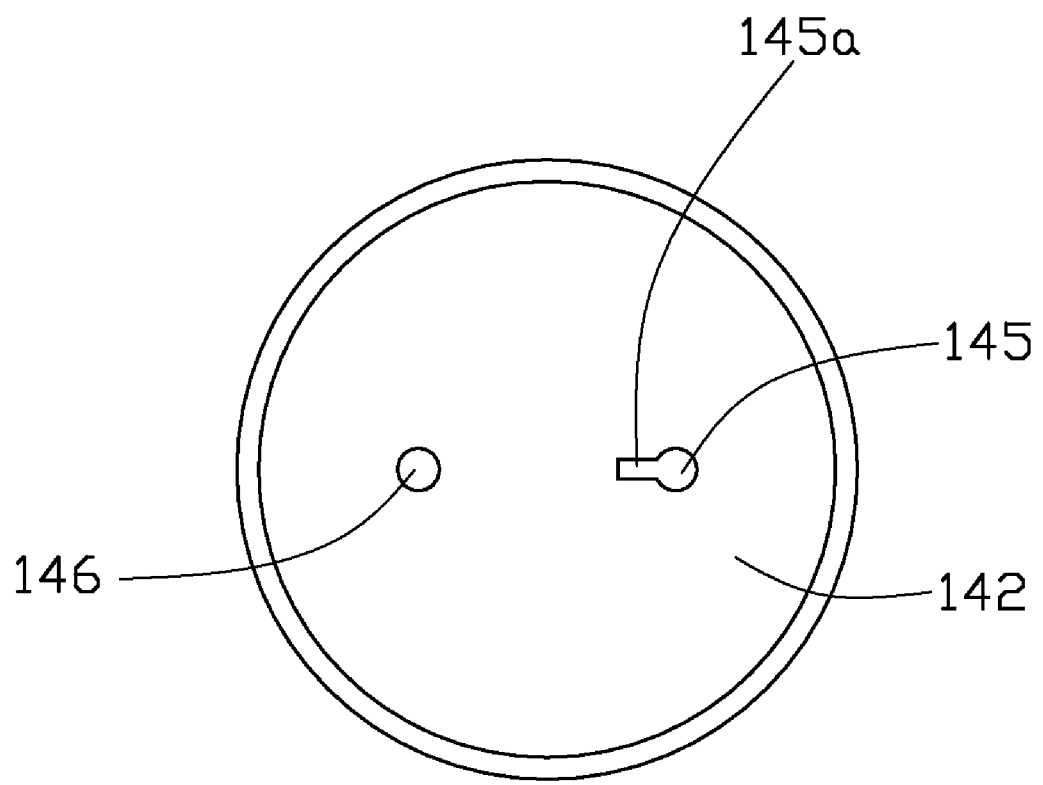
FIG. 3 is a top view of a mounting base of the solid state illumination device of FIG. 2.

Referring also to FIG. 3, the first and second receiving holes 145, 146 are defined in the main body 142 of the mounting base 14 receiving the bottom ends 125b, 126b of the first and second electrodes 125, 126, respectively. The mounting base 14 forms an indent 145a at a top end. The indent 145a communicates with the first receiving hole 145. A height of the indent 145a is greater than or equal to that of the bulge 125c. A cross section of the indent 145a matches that of the bulge 125c so that the bulge 125c can be received in the indent 145a. Preferably, the cross section of the indent 145a is slightly smaller than that of the bulge 125c to aid reception of the bulge 125c therein.

The power supply electrodes 147 include two resilient clips 147a and two wires 147b. The wires 147b electrically connect the clips 147a with an external power supply (not shown). The clips 147a are embedded in the main body 142 of the mounting base 14 with top ends thereof extending into the receiving holes 145, 146 of the mounting base 14. Alternatively, the clips 147a may be not embedded in the main body 142 of the mounting base 14 but directly positioned into the receiving holes 145, 146 of the mounting base 14. The bottom ends 125b, 126b of the first and second electrodes 125, 126 extend into the receiving holes 145, 146 of the mounting base 14, respectively, and are clasped by the clips 147a of the power supply electrodes 147.

In assembly of the solid state illumination device 10, the LED 12 is positioned on the resilient ring 143 of the mounting base 14, with bottom portions of the bottom ends 125b, 126b of the first and second electrodes 125, 126 respectively extending into top portions of the first and second receiving holes 145, 146 of the mounting base 14. The LED 12 is pressed downwardly and slides toward the mounting base 14 until a bottom surface of the encapsulation material 122 contacts a top surface of the mounting base 14. Meanwhile, the bottom ends 125b, 126b of the first and second electrodes 125, 126 are respectively received in the first and second receiving holes 145, 146, and clasped by the clips 147a. The bulge 125c of the first electrode 125 is received in the indent 145a of the first receiving hole 145. The wafer 124 is located above a topmost end of the resilient ring 143 of the mounting base 14, preventing light emitted by the LED 12 from being blocked by the resilient ring 143.

When the LED 12 slides toward the mounting base 14, the annular protrusion 143a of the resilient ring 143 is compressed to distort outwardly when abutted by the annular flange of the LED 12. A radial resilient force is thereby generated and radial inward pressure is exerted on the encapsulation material 122, fixing the LED 12 on the mounting base 14. The bottom ends 125b, 126b of the first and second electrodes 125, 126 are clasped by the clips 147a of the power supply electrodes 147. Friction generated between outer surfaces of the bottom ends 125b, 126b of the first and second electrodes 125, 126 and the clips 147a of the power supply electrodes 147, further fixes the LED 12 on the mounting base 14.

Moreover, the radial pressure exerted on the encapsulation material 122 induces the annular protrusion 143a of the resilient ring 143 to intimately contact with an outer surface of the encapsulation material 122, thereby preventing moisture from entering the mounting base 14 and damaging the first and second electrodes 125, 126.

In the illustrated solid state illumination device 10, the first and second electrodes 125, 126 have different configurations due to the presence of the bulge 125c of the first electrode 125, rendering the first and second electrodes 125, 126 easily distinguishable from one another. Furthermore, due to the indent 145a receiving the bulge 125c defined in the mounting base 14, the first electrode 125 can only be received in the first receiving hole 145 of the mounting base 14, which prevents the first electrode 125 from being erroneously mounted in the second receiving hole.

In the present solid state illumination device 10, the bulge 125c extends from the first electrode 125 towards the second electrode 126. However, the bulge 125c may alternatively extend from the first electrode 125 away from the second electrode 126, or an extension axis of the bulge 125c may form an acute angle with a line passing the first and second electrodes 125, 126. The cross section of the bulge 125c is rectangular. The cross section of the bulge 125c may also alternatively take other configurations such as circular, semicircular, triangular, star-shaped, or other regularly polygonal.

Figure 4:
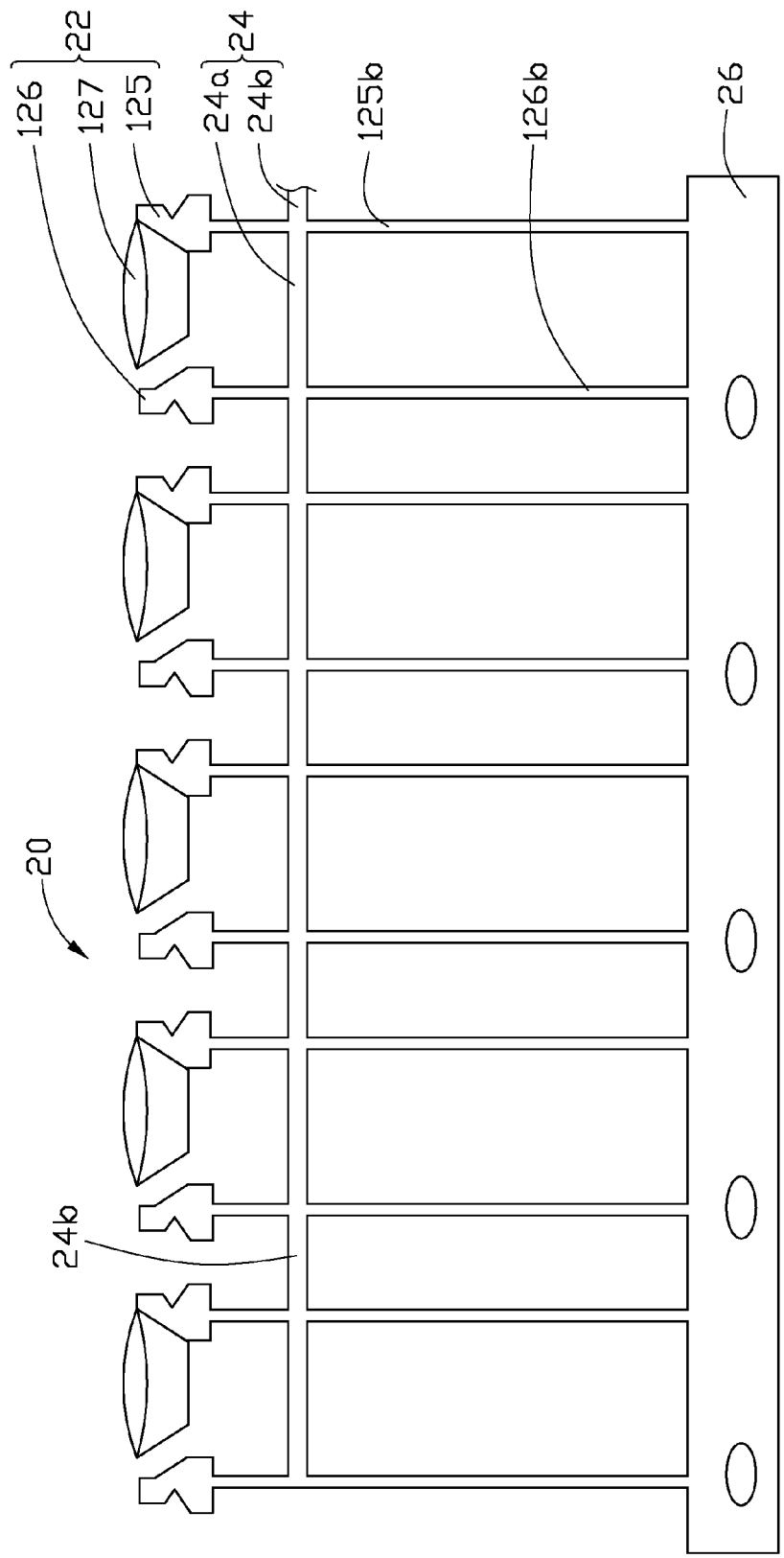
FIG. 4 is a schematic view of a lead frame for manufacturing the solid state illumination device.

Referring to FIG. 4, a method for manufacturing the solid state illumination device 10 includes the following steps.

In Step 1, a lead frame module 20 is provided, including a plurality of lead frames 22. Each of the lead frames 22 includes a housing 127, a first electrode 125 integrally connected with the housing 127, and a second electrode 126 apart from the housing 127 and parallel to the first electrode 125. The first and second electrodes 125, 126 of the lead frames 22 are connected to a single piece via a first pole 24 perpendicular to and connected to the top ends 125a, 126a of the first and second electrodes 125, 126, and a second pole 26 perpendicular to and connected to the bottom ends 125b, 126b of the first and second electrodes 125, 126. The first pole 24 includes a plurality of first portions 24a between the first and second electrodes 125, 126 of a single lead frame 22, and a plurality of second portions 24b located between the first electrode 125 of the lead frame 22 and the second electrode 126 of an adjacent lead frame 22.

In Step 2, a plurality of wafers 124 are bonded to the bottom ends of the housings 127 via sliver adhesive.

In Step 3, gold wires are bonded to the wafers 124 and the first and second electrodes 125, 126, providing electrical connection therebetween.

In Step 4, the wafer 124, the housing 127, and the top ends 125a, 126a of the first and second electrodes 125, 126 are encapsulated in the encapsulation material 122.

In Step 5, the second portions 24b of the first pole 24 are removed and the first portions 24a of the first pole 24 partially removed. The remaining sections of the first portions 24a are connected with the first electrodes 125, and the second pole 26 is then removed from the lead frame module 20. A plurality of separated solid state illumination devices 10 is accordingly obtained.

In Step 5 of the forgoing method, the second portions 24b of the first pole 24 are entirely removed and sections of the first portions 24a connecting with the first electrodes 125 remain. Alternatively, sections of the first portions 24a which connect with the second electrodes 126 may remain. The first portions 24a may be entirely removed and sections of the second portions 24b connecting with the first electrode 125 or the second electrode 126 may remain.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A solid state illumination device comprising:
a solid state light emitting diode comprising an encapsulation material, a wafer, and first and a second electrodes, comprising first ends electrically connecting with the wafer, the wafer and the first ends being encapsulated in the encapsulation material, the first and second electrodes comprising second ends exposed outside the encapsulation material; and
a mounting base comprising a main body with a receptacle defined therein, first and second receiving holes receiving the first and second electrodes, respectively, the main body defining an indent communicating with the first receiving holes receiving a bulge extending from the first electrodes;
wherein the mounting base comprises a resilient ring which comprises an annular protrusion extending inwardly toward an inner space of the resilient ring, a minimum inner diameter of the annular protrusion being less than a diameter of a corresponding portion of the encapsulation material.

2. The solid state illumination device of claim 1, wherein the bulge is exposed outside the encapsulation material.

3. The solid state illumination device of claim 2, wherein the bulge extends from the first electrode toward the second electrode.

4. The solid state illumination device of claim 3, wherein a cross section of the bulge is rectangular.

5. The solid state illumination device of claim 1, wherein the mounting base comprises a pair of power supply electrodes connected with the first and second electrodes, the power supply electrodes each comprising a clip and a wire electrically connected with the clip, the clip being embedded in the main body of the mounting base with top ends thereof extending into the receiving hole of the mounting base.

6. A solid state illumination device comprising:
   a solid state light emitting diode comprising an encapsulation material, a wafer, and first and a second electrodes, comprising first ends electrically connecting with the wafer, the wafer and the first ends being encapsulated in the encapsulation material, the first and second electrodes comprising second ends exposed outside the encapsulation material; and
   a mounting base comprising a main body with a receptacle defined therein, first and second receiving holes receiving the first and second electrodes, respectively, the main body defining an indent communicating with the first receiving holes receiving a bulge extending from the first electrodes;
      wherein the mounting base comprises a pair of power supply electrodes connected with the first and second electrodes, the power supply electrodes each comprising a clip and a wire electrically connected with the clip, the clip being embedded in the main body of the mounting base with top ends thereof extending into the receiving hole of the mounting base.

7. The solid state illumination device of claim 6, wherein the bulge is exposed outside the encapsulation material.

8. The solid state illumination device of claim 7, wherein the bulge extends from the first electrode toward the second electrode.

9. The solid state illumination device of claim 8, wherein a cross section of the bulge is rectangular.

* * * * *